(12) United States Patent
Madathil Sankarankutty Nair et al.

(10) Patent No.: US 10,361,546 B2
(45) Date of Patent: Jul. 23, 2019

(54) ELECTRICAL ENCLOSURE

(71) Applicant: Appleton Grp LLC, Rosemont, IL (US)

(72) Inventors: Satheesh Madathil Sankarankutty Nair, Pune (IN); Rudy Mark D. Halcon, San Isidro Antipolo (PH); Raymond A. Dubiel, Palatine, IL (US); Warren K. Fleras, Chicago, IL (US)

(73) Assignee: Appleton Grp LLC, Rosemont, IL (US)

( * ) Notice: Subject to any disclaimer, the term of this patent is extended or adjusted under 35 U.S.C. 154(b) by 0 days.

(21) Appl. No.: 15/863,301

(22) Filed: Jan. 5, 2018

(65) Prior Publication Data
US 2019/0123536 A1 Apr. 25, 2019

(30) Foreign Application Priority Data

Oct. 23, 2017 (IN) .............................. 201721037407

(51) Int. Cl.
*H02G 3/08* (2006.01)

(52) U.S. Cl.
CPC .................................. *H02G 3/083* (2013.01)

(58) Field of Classification Search
CPC ..................................................... H02G 3/083
USPC .......................................................... 174/50
See application file for complete search history.

(56) References Cited

U.S. PATENT DOCUMENTS

| | | | | |
|---|---|---|---|---|
| 3,197,548 A * | 7/1965 | Weitzman | ................ | H02G 3/10 174/53 |
| 4,664,281 A * | 5/1987 | Falk | ....................... | H02G 3/088 174/50 |
| 5,352,850 A * | 10/1994 | Norris | ....................... | H02G 3/16 174/51 |
| 5,693,909 A * | 12/1997 | McEwen | ................ | H02G 3/088 174/58 |
| 7,087,837 B1 * | 8/2006 | Gretz | ..................... | H02G 3/121 174/53 |
| 7,381,891 B2 * | 6/2008 | Hull | ....................... | H02G 3/126 174/50 |
| 7,825,335 B2 * | 11/2010 | Carbone | ............. | H02G 3/0493 174/50 |
| 8,071,877 B2 * | 12/2011 | Nakayama | ........... | H05K 5/0073 174/50 |

(Continued)

OTHER PUBLICATIONS

Versatile, Direct-Mount Power for Extreme Environments, IP67 SCP-X Power Supplies—Class 2 Listed, SolaHD Brochure, 2015, 6 pages.

(Continued)

*Primary Examiner* — Dhiru R Patel
(74) *Attorney, Agent, or Firm* — McDonnell Boehnen Hulbert & Berghoff LLP

(57) ABSTRACT

An electrical housing including a housing portion defined by a base and sidewalls extending from the base. The housing portion is adapted to be covered by a lid to configure an enclosure for housing electric components therewithin. A flange portion extends from the at least one sidewall for facilitation mounting of the electrical power housing. The flange portion comprises a pair of apertures configured at operative ends of the flange portion, and a corner portion surrounding the pair of apertures. The corner portion is defined by an arcuate projection circumscribing the pair of apertures.

7 Claims, 5 Drawing Sheets

(56) References Cited

U.S. PATENT DOCUMENTS 9,392,711 B2 * 7/2016 Potucek .................. H05K 5/061
9,667,053 B2 * 5/2017 Wurms .................. H02G 3/383

OTHER PUBLICATIONS

Dual Stack Power Supply Product Manual, SCP-X Series 2 x 100 W Models, 2014, 2 pages.
Mech, Fab Nonmet, Encl, SCP 102D24X-D02, Document No. 502-001914-0001, 1 page.
Mech, Fab Nonmet, Othr, Single Stack—Ungrounded-24V, 3.8A, Document No. 502-001773-0002, 2013, 2 pages.
Single Stack Power Supply Product Manual, SCP-X Series 100 W Models, 2015, 2 pages.
SolaHD Distributors Letter dated Jun. 10, 2015, Re: New Generation of IP67 SCP-X Power Supplies: Versatile, Direct Mount Power for Extreme Environments, 2 pages.
SolaHD Data Sheet IP67 SCP-X Extreme Environment Series, 2015, 2 pages.
SolaHD Chapter 3 Power Supplies: IP67 SCP-X Extreme Environment Series, 2015, pp. 138-140.

* cited by examiner

ELECTRICAL ENCLOSURE

RELATED APPLICATIONS

This application claims priority to Indian Patent Application No. IN 201721037407, entitled "An Electrical Housing," filed on Oct. 23, 3017, the contents of which are incorporated by reference in their entirety.

FIELD

The present disclosure relates to the field of electrical housings.

BACKGROUND

Electrical devices, e.g., terminal blocks, power distribution blocks, fuses, fuse holders, conductors, combiners, switches, controllers, and the like are typically housed in enclosures or housings, which are referred to as electrical housings. These housings are of various types. A typical electrical housing 100, as seen in FIG. 1, is made of sturdy plastic material and flange portions 102 configured along a periphery of the housing. A problem associated with the conventional electrical housing 100 is that the stress concentration usually occurs at the apex of the flange portion 102, due to the manufacturing defects or as an aftereffect of a particular manufacturing method, e.g., casting process. Due to this stress concentration, an accidental fall of the electrical housing 100 may cause the flange portions 102 to fail or break, thereby preventing any further usage of the electrical housing 100 as the electrical housing 100 cannot be mounted with broken off flange portions.

Another disadvantage of the conventional electrical housing 100, which is manufactured via the casting process, is that when the molten raw material is introduced in the die, the shape and configuration of the conventional electrical housing 100 is such that a non-uniform distribution of the raw material may occur within the die. A non-uniform distribution of the raw material within the die causes non-uniform cooling of the raw material, thereby causing the warping of the sidewalls of the conventional electrical housing 100. This is not desired.

There is, therefore, a need for an electrical housing that overcomes the aforementioned drawbacks associated with the conventional electrical housings.

OBJECTS

Some of the objects of the present disclosure, which at least one embodiment herein satisfies are as follows:

An object of present disclosure is to provide an electrical housing having reinforced flange portions with better stress distribution characteristics as compared to the conventional electrical housings.

Another object of the present disclosure is to provide an electrical housing in which the warpage of sidewalls does not occur.

Other objects and advantages of the present disclosure will be more apparent from the following description when read in conjunction with the accompanying figure, which are not intended to limit the scope of the present disclosure.

SUMMARY

The present disclosure envisages an electrical housing. The electrical housing comprises a housing portion defined by a base and sidewalls extending from the base. The housing portion is adapted to be covered by a lid to configure an enclosure for housing electric components therewithin. A flange portion extends from one or more sidewalls for facilitating mounting of the electrical power housing. The flange portion comprises a pair of apertures configured at operative ends of the flange portion, and a corner portion surrounding the pair of apertures. The corner portion is defined by an arcuate projection circumscribing the pair of apertures.

In an embodiment, the arcuate projection has a slot configured at an apex of the arcuate portion for preventing stress concentration at the apex, thereby preventing breakage at the corner portions in case of accidental falls.

In another embodiment, the base has raised portions configured thereon, wherein the raised portions extend orthogonally from the base within the enclosure. In an embodiment, the raised portions define an X-shaped profile on the base.

In another embodiment, the electrical housing further comprises a first plurality of ribs configured on an operative inner surface of the sidewalls for reinforcing the sidewalls.

In another embodiment, the electrical housing further comprises a second plurality of ribs configured on an operative outer surface of at least one of the sidewalls at an interface with the flange portions for reinforcing the sidewalls.

In another embodiment, the electrical housing further comprises a plurality of apertures configured on the sidewalls for allowing cables to be received in the housing.

BRIEF DESCRIPTION OF THE ACCOMPANYING DRAWING

An electrical housing, of the present disclosure, will now be described with the help of the accompanying drawing, in which.

DETAILED DESCRIPTION

Figure 1:
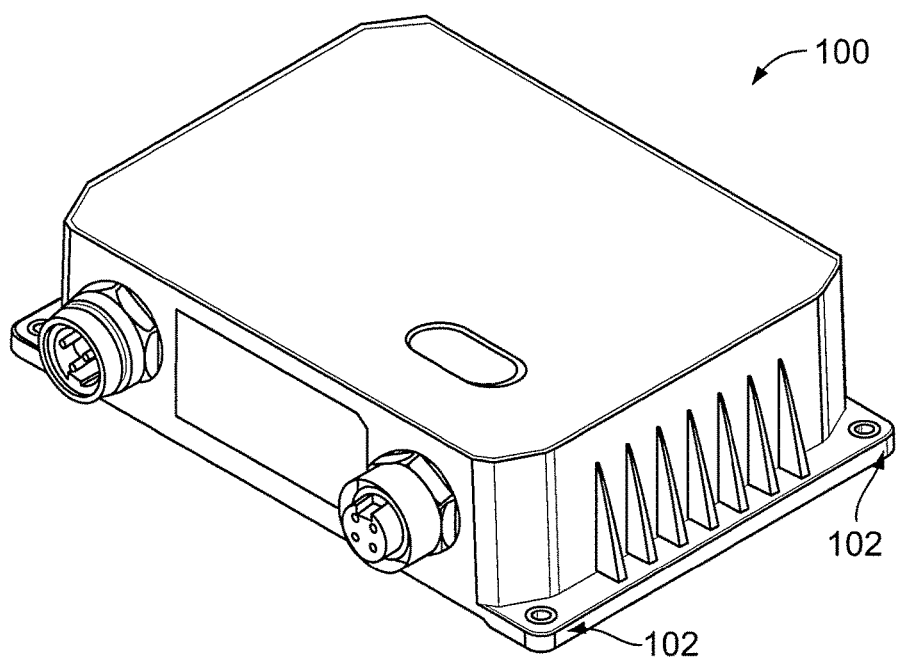
FIG. 1 illustrates an isometric view of a conventional electrical housing.

FIG. 1 illustrates an isometric view of a conventional electrical housing 100 (hereinafter also referred to as housing 100). The housing 100 is used for housing or enclosing electrical devices such as terminal blocks, power distribution blocks, fuses, fuse holders, conductors, combiners, switches, controllers, and the like. The housing 100, as seen in FIG. 1, is made of sturdy plastic material. The housing 100 has flange portions 102 configured along a periphery of the housing 100. A problem associated with the conventional electrical housing 100 is that the stress concentration usually occurs at the apex of the flange portion 102, due to the manufacturing defects or as an aftereffect of a particular manufacturing method, e.g., casting process. Due to this stress concentration, an accidental fall of the electrical housing 100 may cause the flange portions 102 to fail or break, thereby rendering the electrical housing 100 useless as the electrical housing 100 cannot be mounted anywhere with broken off flange portions.

The housing 100 is typically manufactured via the casting process. The configuration of the housing 100 is such that when the molten raw material is introduced in the die, it leads to non-uniform distribution of the raw material across the die. The non-uniform distribution of the raw material within the die causes non-uniform cooling of the raw material, thereby causing the warping of the sidewalls of the end product, i.e., housing 100. This is not desired.

In order to overcome the aforementioned drawbacks associated with the conventional electrical housing 100, the present disclosure envisages an electrical housing having better stress distribution properties at the corner portions. Furthermore, the configuration of the electrical housing, in accordance with the present disclosure, is such that it facilitates uniform distribution of the raw material in the die during the manufacturing of the electrical housing via the casting process.

An electrical housing 200, in accordance with an embodiment of the present disclosure is hereinafter described with reference to FIG. 2A through FIG. 2D. The electrical housing 200 comprises a housing portion 202 defined by a base 202A and sidewalls 202B-202E extending from the base. The housing portion 202 is adapted to be covered by a lid 204 to configure an enclosure for housing electric components therewithin. A flange portion 206 extends from sidewalls 202B and 202E for facilitating mounting of the housing 200. The flange portion 206 comprises a pair of apertures 208 configured at operative ends of the flange portion 206, and a corner portion 210 surrounding the pair of apertures 208. The corner portion 210 is defined by an arcuate projection circumscribing the aperture 208.

In an embodiment, the arcuate projection of the corner portion 210 has a slot 212 configured at an apex of the arcuate portion for preventing stress concentration at the apex, thereby preventing breakage at the corner portions in case of accidental falls. The slot 212 also extends in an extension 212A, as seen in FIG. 2E, configured on the operative bottom surface of the corner portion 210 across the aperture 208. More specifically, the slot 212 and the extension 212A of the slot 212 provide relatively more surface area for efficient stress distribution at the corner portions 210. As such, the stress concentration at the apex of the corner portion 210 is prevented, due to which the housing 200 can withstand accidental falls without the breakage or failure of the corner portions 210.

In another embodiment, the base 202A has raised portions 202A', 202A" configured thereon, wherein the raised portions 202A', 202A" extend orthogonally from the base 202A within the enclosure. In an embodiment, the raised portions define an X-shaped profile on the base 202A. The advantage of the raised portions 202A', 202A" is that the raised portions 202A', 202A" facilitate a uniform distribution of the plastic raw material in the die during the manufacturing of the housing 200 via the casting process. Due to the uniform distribution of the plastic raw material in the die, uniform cooling of the plastic raw material takes place. The uniform cooling of the plastic raw material prevents any kind of warpage in the end product, i.e., the housing 200.

Figure 2A:
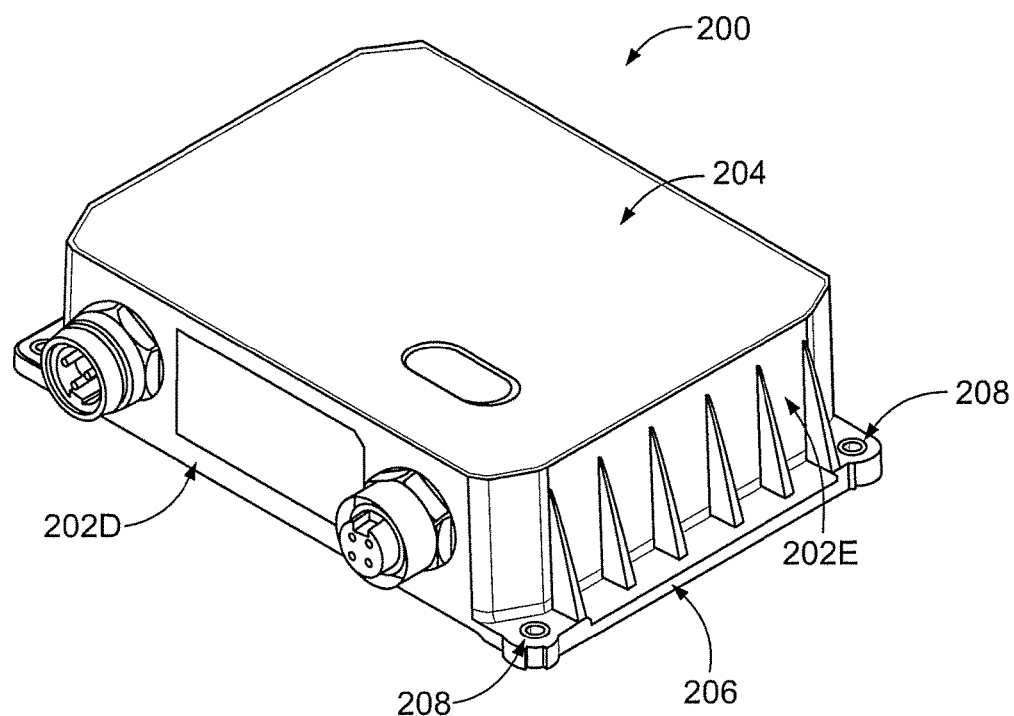
FIG. 2A illustrates an isometric view of an electrical housing, in accordance with an embodiment of the present disclosure.
Figure 2B:
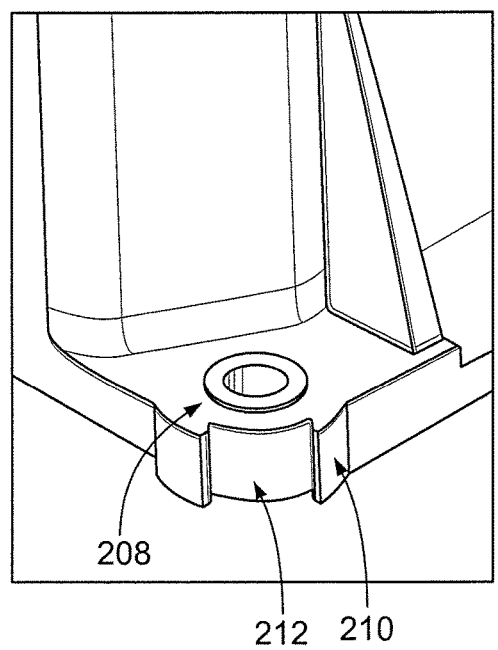
FIG. 2B illustrates an enlarged isometric view of a corner portion of the electrical housing of FIG. 2A.
Figure 2C:
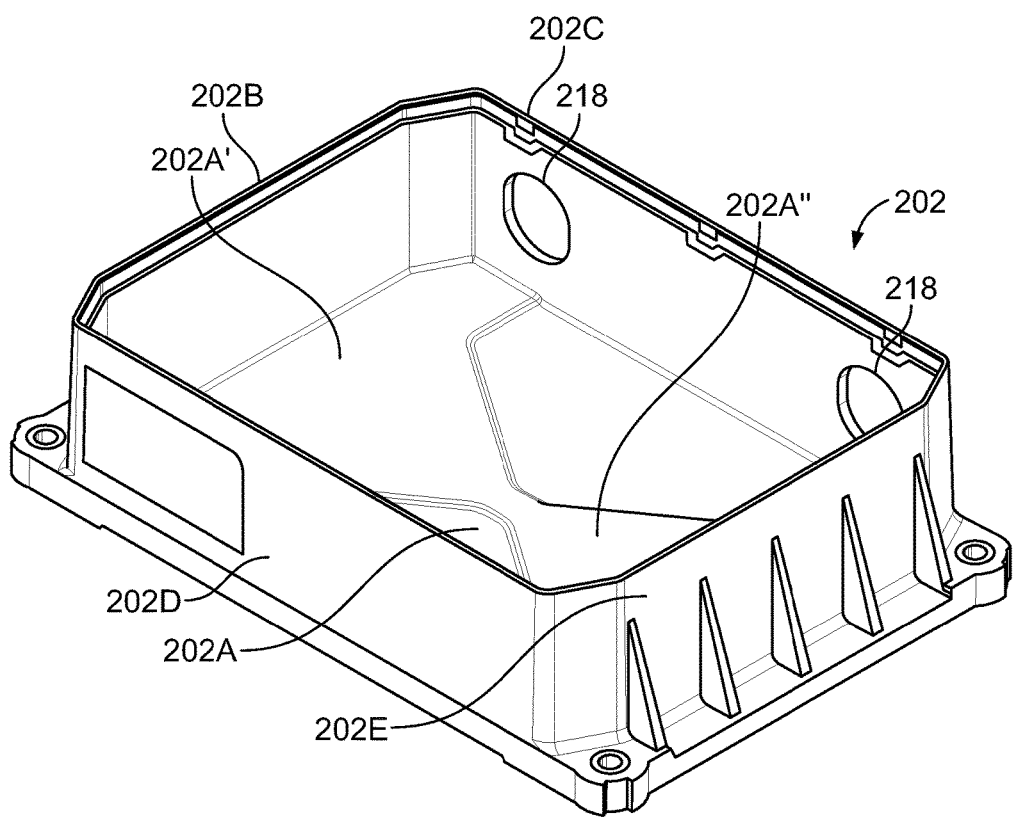
FIG. 2C illustrates an isometric view of the electrical housing of FIG. 2A, without the lid.
Figure 2D:
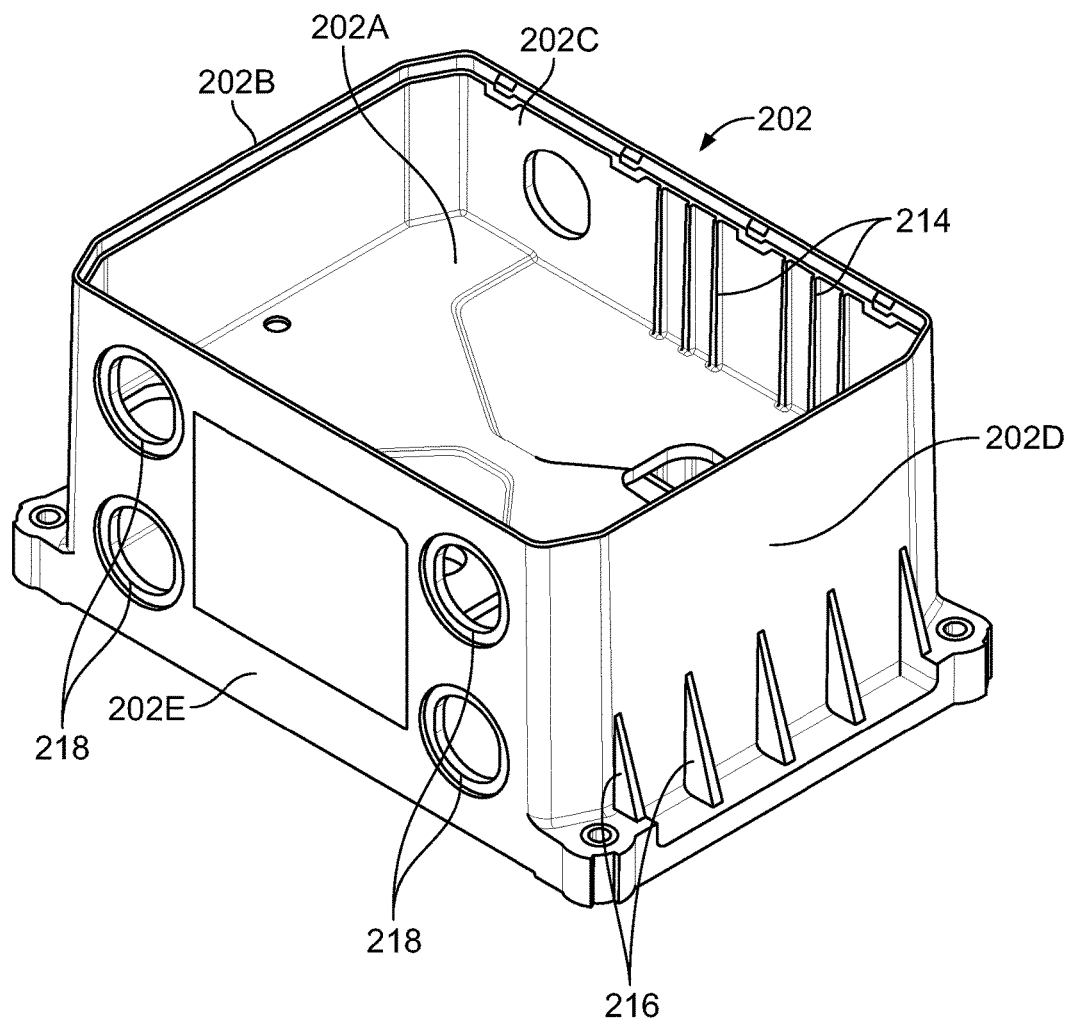
FIG. 2D illustrates an isometric view of an electrical housing without the lid, in accordance with another embodiment of the present disclosure.
Figure 2E:
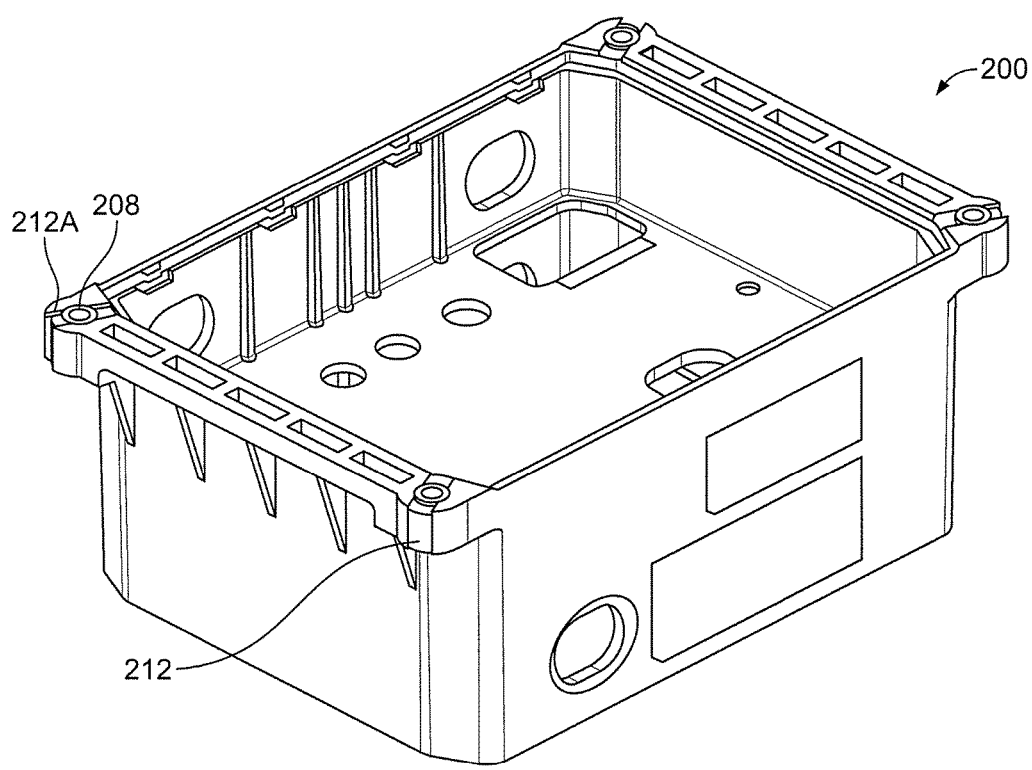
FIG. 2E illustrates another isometric view of the electrical housing of FIG. 2D.

In another embodiment, as seen in FIG. 2D, the electrical housing 200 further comprises a first plurality of ribs 214 configured on an operative inner surface of sidewalls 202C and 202E for reinforcing the sidewalls 202C and 202E. The first plurality of ribs 214 strengthen the sidewalls 202C and 202E and also prevent the warpage thereof.

In another embodiment, the electrical housing 200 further comprises a second plurality of ribs 216 configured on an operative outer surface of sidewalls 202B and 202D at an interface with the flange portions 206 for reinforcing the sidewalls 202B and 202D.

In another embodiment, the electrical housing 200 further comprises a plurality of apertures 218 configured on the sidewalls for allowing cables to be received in the housing 200.

The advantage of the electrical housing 200 is that the slots 212 facilitate optimal stress distribution at the corner portions 210 of the electrical housing 200. The absence of stress concentration at the apex of the corner portions 210 prevents the breakage or failure of the corner portions 210 in case of accidental falls. Furthermore, the configuration of the base 202A with the raised portions 202A', 202A" facilitates uniform distribution and uniform cooling of the molten raw material within the dies during the manufacturing of the electrical housing 200 via the casting process. The uniform distribution and uniform cooling of the molten raw material prevents the warpage of the sidewalls 202B-202E in the housing 200.

TECHNICAL ADVANCEMENTS

The present disclosure described herein above has several technical advantages including, but not limited to, an electrical housing:

having reinforced flange portions with better stress distribution characteristics at the corner portions as compared to the conventional electrical housings; and in which the warpage of sidewalls does not occur.

The disclosure has been described with reference to the accompanying embodiments which do not limit the scope and ambit of the disclosure. The description provided is purely by way of example and illustration.

The embodiments herein and the various features and advantageous details thereof are explained with reference to the non-limiting embodiments in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The foregoing description of the specific embodiments so fully revealed the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The use of the expression "at least" or "at least one" suggests the use of one or more elements or ingredients or quantities, as the use may be in the embodiment of the disclosure to achieve one or more of the desired objects or results.

Any discussion of documents, acts, materials, devices, articles or the like that has been included in this specification is solely for the purpose of providing a context for the disclosure. It is not to be taken as an admission that any or all of these matters form a part of the prior art base or were common general knowledge in the field relevant to the disclosure as it existed anywhere before the priority date of this application.

The numerical values mentioned for the various physical parameters, dimensions or quantities are only approximations and it is envisaged that the values higher/lower than the numerical values assigned to the parameters, dimensions or quantities fall within the scope of the disclosure, unless there is a statement in the specification specific to the contrary.

While considerable emphasis has been placed herein on the components and component parts of the preferred embodiments, it will be appreciated that many embodiments can be made and that many changes can be made in the preferred embodiments without departing from the principles of the disclosure. These and other changes in the preferred embodiment as well as other embodiments of the disclosure will be apparent to those skilled in the art from the disclosure herein, whereby it is to be distinctly understood that the foregoing descriptive matter is to be interpreted merely as illustrative of the disclosure and not as a limitation.

We claim:

1. An electrical housing comprising:
   a base defined by a plurality of sidewalls extending from the base;
   a first flange portion extending from a first sidewall and the first flange portion extending an entire length of the first sidewall, said flange portion comprising:
   a first aperture and a second aperture positioned at opposite ends of the first flange portion; and
   a first corner portion of the first flange portion surrounding the first aperture and a second corner portion of the first flange portion surrounding the second aperture, said first corner portion having an arcuate projection circumscribing the first aperture and said second corner portion having an arcuate projection circumscribing the second aperture, wherein each of said arcuate projections has a downwardly extending slot positioned at an apex of said arcuate projection to prevent stress concentration at said apex, thereby preventing breakage at said corner portions in case of accidental falls; and
   wherein said slot also extends along a bottom surface of the corner portion to provide relatively more surface area for efficient stress distribution at the corner portion to prevent the stress concentration at the apex of the corner portion such that the electrical housing can withstand accidental falls without the breakage or failure of the corner portion.

2. The electrical housing as claimed in claim 1, wherein one of the plurality of sidewalls includes a plurality of ribs configured on an inner surface of the sidewall for reinforcing the sidewall.

3. The electrical housing as claimed in claim 1, further comprising a plurality of apertures positioned on one or more of said sidewalls for allowing cables to be received in said housing.

4. The electrical housing as claimed in claim 1, further including a second flange portion extending from a second sidewall opposite the first flange portion, and the second flange portion extending an entire length of the second sidewall to facilitate mounting of the electrical housing, said flange portion comprising:
   a third aperture and a fourth aperture positioned at opposite ends of the second flange portion; and
   a third corner portion surrounding the third aperture and a fourth second corner portion surrounding the fourth apertures, said third corner portion having an arcuate projection circumscribing the third aperture and said fourth corner portion having an arcuate projection circumscribing the fourth aperture;
   wherein each of said arcuate projections on the third and fourth corner portions has a downwardly extending slot positioned at an apex of said arcuate projection to prevent stress concentration at the apex, thereby preventing breakage at said corner portions in case of accidental falls.

5. An electrical housing comprising:
   a base defined by a plurality of sidewalls extending from the base;
   a first flange portion extending from a first sidewall and the first flange portion extending an entire length of the first sidewall to facilitate mounting of the electrical housing, said flange portion comprising:
   a first aperture and a second aperture positioned at both ends of the first flange portion; and
   a first corner portion of the first flange portion surrounding the first aperture and a second corner portion of the first flange portion surrounding the second aperture, said first corner portion having an arcuate projection circumscribing the first aperture and said second corner portion having an arcuate projection circumscribing the second aperture;
   wherein each of said arcuate projections has a downwardly extending slot positioned at an apex of said arcuate projection to prevent stress concentration at said apex, thereby preventing breakage at said corner portions in case of accidental falls; and
   wherein said base has raised portions positioned thereon, wherein said raised portions extend orthogonally from said base within said electrical enclosure.

6. The electrical housing as claimed in claim 5, wherein said raised portions define an X-shaped profile on said base.

7. The electrical housing as claimed in claim 5, wherein one of the plurality of sidewalls includes a plurality of ribs positioned on an outer surface of the sidewall at an interface with said flange portions for reinforcing the sidewall.

* * * * *